Sept. 15, 1953 J. H. GUYTON 2,652,494
SIGNAL SEEKING TUNER
Filed Dec. 1, 1950
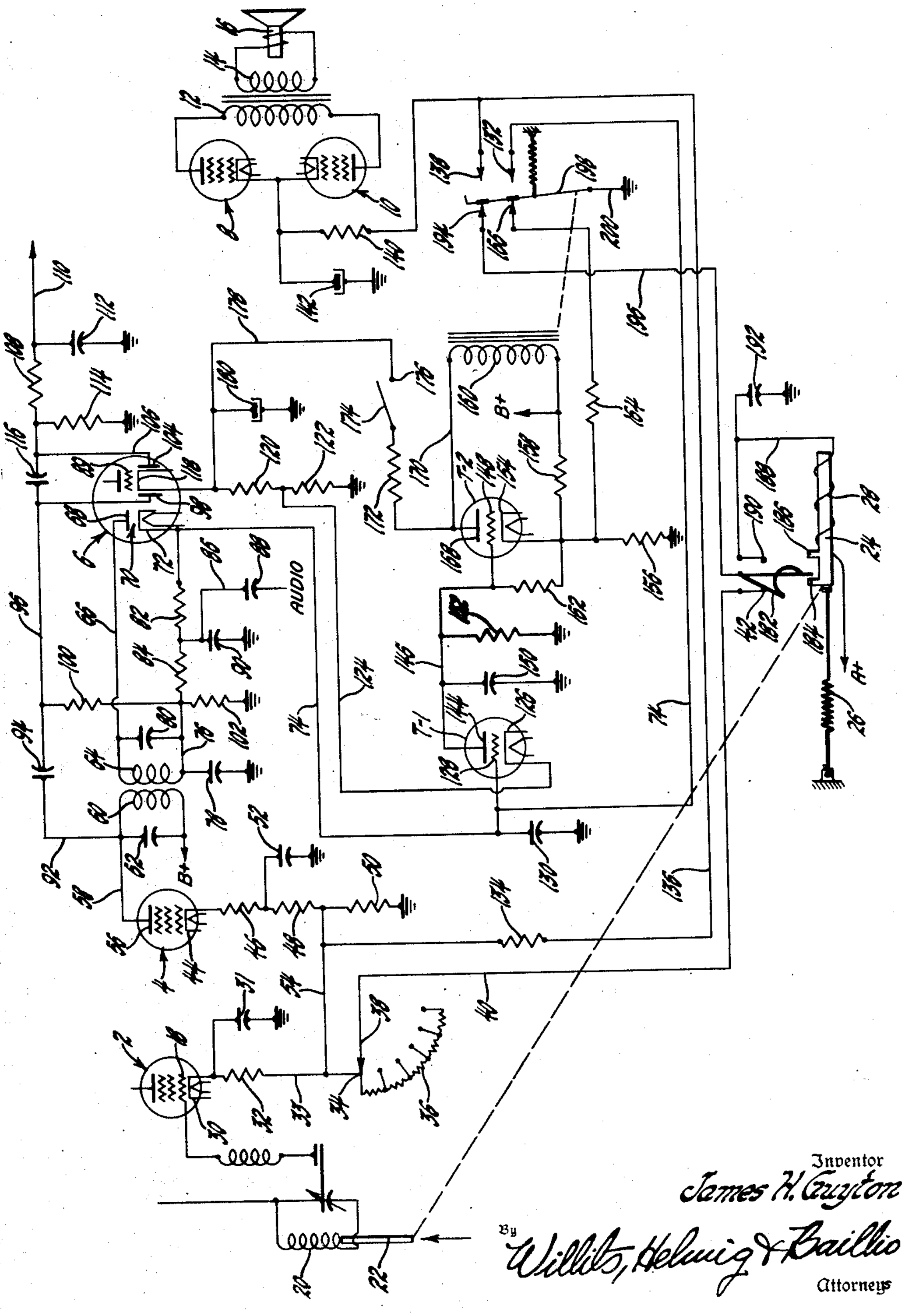
Inventor
James H. Guyton
By Willits, Helwig & Baillio
Attorneys Patented Sept. 15, 1953 2,652,494

UNITED STATES PATENT OFFICE 2,652,494

SIGNAL SEEKING TUNER

James H. Guyton, Kokomo, Ind., assignor to General Motors Corporation, Detroit, Mich., a corporation of Delaware Application December 1, 1950, Serial No. 198,648

9 Claims. (Cl. 250—40)

This invention relates to indexing control means and more particularly to means for indexing a scanning system through the appearance of a signal at the scanning apparatus.

While the invention has broad application and will find utility in various fields, it is particularly applicable to automatic tuning means for radio receivers and the specific disclosure will deal with such a system.

Automatic tuning of radio receivers has been very useful in those receivers adapted to be installed in vehicles primarily from a safety standpoint. It is, of course, dangerous for a driver to divert his attention from operating the car and turn it to obtaining radio reception. The automobile receivers were therefore provided with various means for automatically tuning the set, one of the most popular types being the mechanical push button form.

In this form the receiver was provided with a number of longitudinally movable slide assemblies having a button on the outer end engageable by the operator so that it could be forced inwardly. These slides carried adjustable cam means thereon which engaged movable means connected directly to the tuning means of the receiver. Thus the setting of the cam would determine the position of the tuner and the station received. Such a tuner is shown in Patent #2,494,008, issued January 10, 1950, to B. A. Schwarz et al. With a tuner of this type a plurality of favorite stations can be set up on the buttons and inward pressure on a given button will bring in the present station. This can be done with only minor attention being diverted from the main task of car operation.

However, with the improvement in cars and highways, distance is now covered rapidly and the car operator can, in a relatively short period of time, move out of the locality of the stations set on the push button tuner and, in order to receive the stations in the new locality, either has to reset the cams to new positions corresponding to the wave lengths of the new stations or use the manual tuning knob which requires more attention.

Tuners have been designed to overcome the need for previously adjusting or setting index mechanisms which are indexed or tuned by the reception of an incoming signal in the receiver. They have been referred to as signal-seeking tuners or stop-on-signal tuners. Scanning means are provided in these tuners to cause the tuning means to be driven over the band and also to stop or index the tuning means on a station upon receipt of an incoming signal of sufficient strength from that station.

It is an object of my invention to provide a control system to actuate indexing means upon receipt of a control signal.

It is a further object of my invention to provide a control system to index or stop a scanning means for a frequency spectrum upon receipt of a transmitted carrier signal.

It is a further object of my invention to provide a control system to index a scanning tuning means upon the tuning in of a carrier signal and which may be adjusted in sensitivity to index on strong signals only or strong and weak signals.

With the above and other objects in view, my invention will be best understood by reference to the following specification and claims and the illustrations in the accompanying drawing, in which:

The figure is a circuit diagram of a control system embodying my invention.

The control system is applied to a conventional superheterodyne receiver having radio frequency, intermediate frequency, detector and audio frequency stages feeding into a speaker. The tuning means is actuated to scan the band by any suitable means such for example as the mechanism disclosed in a copending application S. N. 183,069, filed September 2, 1950, in the names of Bertram A. Schwarz and Manfred G. Wright and assigned to a common assignee. This type tuner scans the band in one direction through a spring drive and is quickly returned to its opposite limit by a solenoid controlled by limit switches. During scanning action the drive may be stopped by a control relay becoming deenergized when a signal is received.

With the preceding as a general background, reference is specifically made to the figure in which only such portions of the conventional receiver circuit are shown as are necessary to illustrate my invention to simplify the showing. One of the radio frequency amplifier tubes 2 is shown as well as an intermediate frequency amplifier tube 4. The intermediate frequency amplifier is followed by a detector and first audio stage 6. This latter works into a push-pull amplifier 8—10 to which a transformer primary 12 is connected. The transformer secondary 14 inductively associated with the primary 12 is directly connected to a speaker 16. The first radio frequency amplifier tube 2 is shown as having its grid 18 connected to a resonant circuit including an inductance coil 20 tuned by movement of a core 22, as shown by the arrow. The other tuned circuits are not shown for simplification. The tuning means of which the core 22 forms a part is mechanically coupled to and moves with a member 24 which is moved in one direction by a spring 26 and in the opposite direction by solenoid 28.

The cathode 30 of tube 2 is connected through condenser 31 to ground and also to resistor 32 and then through line 33 to contact 34 on potentiometer 36, having a plurality of taps. A variably positioned switch arm 38 is adapted to engage the contact 34 and other contacts connected to the taps of the potentiometer. Line 40 connects arm 38 to stationary contact 42 of a snap-over reversing switch. Cathode 44 of the tube 4 is connected through three resistances 46, 48 and 50 in series to ground. Condenser 52 connects a point between resistors 46 and 48 to ground and tie line 54 interconnects a point between resistors 48 and 50 to line 33.

The plate 56 of the tube 4 is connected through line 58 to one side of the resonant circuit consisting of the intermediate transformer primary 60 and condenser 62, the opposite side being connected to a voltage source indicated as B+. The secondary coil 64 of the intermediate frequency transformer is connected through line 66 to one electrode 68 of a diode section 70 of tube 6, the other electrode 72 of which is connected to line 74. The opposite side of the secondary coil 64 is connected to line 76 and to ground through condenser 78. A condenser 80 is connected across the secondary 64 to form the secondary resonant circuit. The resistances 82 and 84 are connected in series relation between lines 76 and 74. Line 86 is connected to a point between resistors 82 and 84 and extends to a condenser 88 and then to the first audio amplifier stage 89 in tube 6. Line 86 is also connected to ground through condenser 90.

The intermediate frequency primary circuit is also connected through line 92 to condenser 94 and thence through line 96 to a diode anode 98 in tube 6 and a resistance 100 is connected across lines 96 and 76, resistance 102 connecting the latter to ground. A second diode anode 104 is connected to line 106, the opposite end of which is connected to resistor 108 and which provides the automatic volume control voltage through line 110 connected to the other end of resistor 108. A condenser 112 is connected between line 110 and ground and resistor 114 is connected between line 106 and ground to provide a voltage delay circuit for diode 104. Condenser 116 is connected between lines 96 and 106.

The cathode 118 of tube 6 is connected to two resistors 120 and 122 in series, the opposite end of resistor 122 being grounded. Line 124 is connected to a point between resistors 120 and 122 and to cathode 126 of the first triode section T-1 of a control trigger device. Line 74 is connected to grid 128 of this section and also to ground through condenser 130 and to stationary contact 132 of a relay-operated switch 160. Line 54 is also connected to one terminal of a resistor 134, the opposite terminal of which is connected through line 136 to stationary contact 138 of the relay switch and also to a resistor 140. The opposite terminal of resistor 140 is connected to the cathodes of the push-pull amplifier 8-10 and to ground through condenser 142.

The plate 144 of the first section T-1 of the trigger device is connected through line 146 with the grid 148 of the second section T-2 of the trigger control device. Condenser 150 and resistor 152 connect the line 146 to ground through parallel paths. The cathode 154 of the second section T-2 is connected to ground through resistor 156 and through resistor 158 to one terminal of the relay-operating coil 160. The positive source of voltage is also connected at this point indicated as B+. A resistor 162 is connected between the cathode 154 and grid 148 of this section. A resistor 164 is connected between the cathode 154 and stationary contact 166 of the relay-operated switch.

The plate 168 of the second section T-2 of the trigger control tube is connected through line 170 with the opposite terminal of the relay coil 160 and also through resistor 172 to the movable switch arm 174 actuated by the push bar to cause the set to move on to the next station. The stationary switch contact 176 is connected through line 178 with cathode 118 of the tube 6. Condenser 180 is connected between line 178 and ground.

The reversing switch is as before mentioned a snap-over switch which remains in its last actuated position until moved in the opposite direction. Through toggle action movement of the actuating arm in one direction causes the switch arm 182 to close in the opposite direction. In the present structure the movable arm 182 of the switch is moved by either of the two projections 184 or 186 on the member 24 as it moves back and forth. Thus as the tuner is scanning in one direction the switch will be in the position shown. When the tuner reaches the end of travel the projection 186 engages the arm 182 to throw the same to the opposite side, which energizes the solenoid to recock the spring. The solenoid coil therefore has one terminal connected to a source of power indicated as A+ and the opposite terminal connected to line 188 which extends to a stationary contact 190 engageable with the reversing switch arm 182. A condenser 192 is connected between line 188 and ground.

The central movable arm 182 of the switch is connected to a stationary contact 194 of the relay by line 196. The armature 198 of the relay is conductive and connected to ground by line 200; thus it completes a circuit to ground for the contacts with which it may be in engagement. It is shown in solenoid-deenergized position.

In general there is provided an automatic tuning system which scans the band in one direction by moving a tuning means as illustratively shown by the core 22 by moving a member such as 24, due to a spring load 26. This connection is indicated by the dotted line between the two. As the spring 26 moves the member 24 to one limit, the projection 186 will engage and throw the switch arm 182 over into engagement with stationary contact 190 to complete the following energizing circuit for the solenoid: power source A+, solenoid coil 28, line 188, contact 190, arm 182, line 196, contact 194, armature 198, line 200 to ground. This energizes the solenoid and it causes member 24 to move rapidly to the right as shown in the figure against the force of the spring. This action at the right limit of movement brings projection 184 against the switch arm 182 causing it to be thrown to the left against contact 42 and away from contact 190. The energizing circuit for the solenoid coil just traced is broken at 190—182. The spring now again causes the tuner to scan, thus providing an alternate scan and recock cycle.

The movement of the member 24 during the scanning portion of the cycle may be arrested by certain indexing means (not shown) moved in response to relay energization and deenergization, at the same time that said relay 160 moves its armature 198. The relay 160 is controlled by the two tubes shown just to the left thereof in the drawing. These two are shown as separate triodes and have been referred to hereinbefore as the first and second sections. They may be two separate tubes or they may be two triode sections of a single tube. The second section, which we will refer to as T-2 directly controls the energization and deenergization of the relay 160, and the first tube or section T-1 is provided to enable the system to have sufficient negative voltage on the grid of the section T-2 to cut off plate current whenever an incoming station is received.

Assuming that the system is in scanning condition and that the spring 26 is pulling the member 24 slowly across the band, tube T-2 will be conducting and the supply circuit for the relay will be from a power source indicated at B+ through relay coil 160, line 170, the electron stream of the tube section T-2, through resistor 164, contact 166, armature 198, line 200 to ground. There is also a parallel path through resistance 156 to ground but this is a much higher resistance. Thus, the relay will remain energized, maintaining the stopping means operated thereby out of contact with the member 24 and it may proceed on its way. At the same time the tube section T-1 is maintained in non-conductive condition, due to the fact that the grid 128 thereof is connected through line 74 to a diode rectifier 70 which maintains ground potential on this grid and the cathode 126 of the tube section T-1 is maintained at a higher potential through its connection line 124 back to a tap between resistances 120 and 122 which form the AVC delay.

When an incoming station is tuned in, however, a control pulse is developed on line 74, which is positive and drives the grid 128 of section T-1 positive to permit that triode section to conduct, and when T-1 conducts it develops a voltage across resistor 162, driving the grid 148 of T-2 negative, and therefore cutting off the flow of plate current in section T-2 which immediately deenergizes the relay 160. When the relay 160 is deenergized it applies the stopping means to the movement of the member 24 and at the same time its armature 198 moves from contact with stationary contacts 166 and 194 over into engagement with stationary contacts 132 and 138. Movement away from contact 194 opens the circuit from the reversing switch 42, 182, 190 so that the solenoid coil 28 can now not be energized. Movement of the armature 198 away from stationary contact 166 breaks the circuit to resistance 164, which is of much smaller size than resistance 156, and therefore inserts the latter resistance alone in the cathode circuit of the tube section T-2 to maintain it from again being energized. Engagement of the armature 198 with stationary contacts 138 and 132 accomplishes two other results. The engagement of the same with stationary contact 138 grounds line 136, thus effectively disconnecting the sensitivity control 36 and providing through resistor 140 the proper cathode bias on the push-pull output tubes 8 and 10. At the same time closure of the armature 198 with contact 132 effectively directly grounds the grid 128 of the tube section T-1. The receiver is now in exact tune on station, and the desired station may be listened to.

If the operator becomes tired of listening to the station now being received, he may move on to the next station by merely forcing inwardly switch arm 174, closing the circuit 174, 176. This completes the following circuit for the relay coil: source of power B+, relay coil 160, line 170, resistance 172, switch 174—176, line 178, resistance 120, resistance 122 to ground. This again energizes the relay coil 160 and causes the armature 198 to move back to the left-hand position as shown in the figure, at which point it contacts stationary contacts 194 and 166. The energizing connection through the switch 174 and 176 is through the resistance 172 but directly connected to the top of the two resistances 120 and 122 in series which are provided for the AVC delay. It is connected to the top of these two resistances in order to prevent the tuner from stopping on the same station to which it was previously tuned, when the switch 174—176 is depressed and released quickly, as previously mentioned, the cathode voltage for the section T-1 is taken from the same AVC delay system, and therefore, by triggering the relay coil to the same system, the cathode voltage on the section T-1 is increased while the push button switch is depressed, and for a short time after the same is released; therefore, making it easier to get off of the present station.

The portion of the system in which the triggering pulse is generated in order to stop the tuner on station is that section including the intermediate frequency transformer consisting of primary 60 and secondary 64 and the diode sections 68—72 and 98—118 of the first audio tube 6. Two signals are taken, one from the primary and one from the secondary portion of this circuit, and are rectified and algebraically added, one of said rectifiers being biased and the other unbiased, the resultant voltage providing a positive pulse on the control line 74. The primary of the IF transformer 60—62 provides a signal for the diode section 98—118 of tube 6 through line 92, condenser 94 and line 96 when a station is tuned in. This develops a voltage across resistances 100—102 of a given polarity after the signal has become strong enough to overcome the bias provided in the cathode circuit by resistors 120 and 122. At the same time the secondary 64—80 of the same IF transformer supplies the induced signal to the diode 68—72 which latter diode is unbiased. This diode 68—72 develops a voltage across resistors 82—84 of a polarity which is opposed to that of resistors 100—102. A tapped connection is used in the latter resistance chain to accommodate the voltage ratio of the IF transformer. The voltages developed across resistors 102 and 82—84 are thus added algebraically since they are serially connected and the control pulse resulting is applied to line 74 which is of a value equal to a fixed proportion of the biasing voltage applied to the diode 98—118. This particular mode of operation is the subject matter of a copending application S. N. 106,223, filed July 22, 1949, entitled "Triggering System." This positive control plus therefore controls the conductive periods of the first section T-1 of the trigger tubes, as previously defined.

It will be obvious that when the switching system is in condition to provide a searching or scanning action, there is included in this system through contact between stationary contact 42 and movable switch arm 182 a sensitivity control which consists of a tapped resistance, said taps being engageable by a movable arm 38 to provide for the insertion of more or less resistance in the cathode path of the RF and IF amplifier tubes 2 and 4. In this manner the bias of the amplifier tubes can be changed and therefore the sensitivity or strength of the incoming signal, and by so doing by moving the arm 38 to the various taps the operator can determine the strength of incoming signals which will operate the tuning mechanism. In other words, he may desire to only have the set stop on the certain local strong stations, being few in number, and in that case he would change the sensitivity of the set so that it will remain relatively insensitive and only operate on stronger signals. On the other hand he may desire to have the set pick up almost any station which is on the air and in this case he will increase the sensitivity of the set and make it sensitive to stop on almost any signal which the set is capable of picking up. It will also be noted by reference to the drawing that the sensitivity control is inserted in circuit by the contact between contact 194 and the armature 198 to complete the circuit from the sensitivity control to ground and is only included in controlling circuits when the set is tuning and is cut when on station. The sensitivity of the receiver while the operator is listening to a station is of course unaffected as it remains at a predetermined value after the set has come to rest on a desired station.

Reviewing the functions of the various switches operated by the relay, contact 166 provides a circuit to give the relay tube its ability to remain energized while it is searching, and it definitely disables the relay tube when the armature moves away to so-called "on-station" position. Contact 132, as before mentioned, provides a grounding system for the bottom of the secondary diode load in the on-station position, thus putting the basic receiver in normal listening condition. In the search position, when it is open, the secondary diode load is ungrounded, which provides a means of developing a trigger voltage and passing it on to the relay tube. Contact 194 has just been mentioned and this provides the switching in of the sensitivity control so that the operator may determine the relative number of stations he desires to tune in as he scans the band. This contact also completes the system for energizing the solenoid at the end of the tuner stroke so that it can return the tuner to a position to continue its scanning, and it also makes it impossible for the receiver to stop on stations during the solenoid stroke of the tuner which, as before mentioned, is very rapid, and at the same time decreases the current drain of the output tubes while the receiver is searching.

The last contact 138 maintains the cathode circuit of the output tubes ungrounded while searching, and thus decreases the current drain of the output stage while the relay tube is drawing current, and therefore the current drain is approximately the same whether the receiver is searching or whether it is tuned into a station, and the vibrator supply is not overloaded. The opening of this contact also ungrounds resistor 134 in the cathodes of the RF and IF amplifiers. When this resistor is grounded in the on-station position, it insures the receiver of a constant sensitivity. While the receiver is searching or tuning, of course, the sensitivity control is grounded through the reversing switch and that takes preference. The means for making it impossible for the receiver to stop on the return stroke of the solenoid is as follows: With the relay in the search position and the armature 198 to the left as shown in the figure, and with the reversing switch 182 in the tuner return or right-hand position, it will be seen that there is a very high resistance in series with the cathodes of the RF and IF amplifiers, namely resistor 58 which is very large and which cuts down the effectiveness of the amplifier, making it impossible for the receiver to stop on the return tuner stroke. It should also be noted that both the reversing switch 182 and the relay armature 198 are in the energizing circuit for the solenoid. The purpose of this is so that the solenoid will not become energized when the reversing switch is thrown while the receiver is being tuned manually.

I claim:

1. In radio receiving means having radio and audio amplifying and detecting sections and means to tune the receiver over a predetermined frequency spectrum, driving means to move the tuning means in either direction over said spectrum, conductive means connected to the detector section upon which a voltage is developed upon receipt of an incoming signal, a second conductive means upon which a voltage is developed in inverse phase connected to said detector section, time delay means in circuit with said second conductive means, relay means controlling said driving means, an electron tube having a cathode, control grid and anode, said first conductive means being connected to said grid, means connecting the cathode to said time delay means, means connecting said anode to the relay means and to the time delay means including a switch, said time delay means maintaining energization of said relay means for a period after initial energization to insure that the driving means controlled thereby will move on to the next station.

2. In radio receiving means having radio and audio amplifying and detecting sections and means to tune the receiver over a predetermined frequency spectrum, driving means to move the tuning means in either direction over said spectrum, conductive means connected to the detector section upon which a voltage is developed upon receipt of an incoming signal, a triode having a cathode, grid and plate, said conductive means being connected to said grid to control conductive periods of said triode, a relay connected to said plate, switching means to control the driving means operated by the relay, and adjustable means for controlling the sentitivity of the receiver connected to the switching means and to the radio amplifying portion of the receiver to change and adjust the sensitivity during the scanning and signal receiving periods of operation.

3. In radio receiving means having radio and audio amplifying and detecting sections and means to tune the receiver over a predetermined frequency band, driving means to move the tuning means slowly to scan the band in one direction and quickly return it in the opposite direction, coupling means connected between the radio section and the detector section in which a control pulse is generated, a multistage control section, means connecting said coupling means to the input of the first stage of the control section so that the generated pulse will operate the same, means in the detector stage for developing a second control voltage for maintaining the amplitude of the output signal of the radio amplifier section substantially constant, time delay means in the later means, a second stage in the control section controlled by the first, relay means connected in the output of the second stage, switching means controlled by said relay, means interconnecting the cathode of the first stage of the control section to the time delay means to provide a bias therefor and means including further switching means connecting the relay to the time delay means, the two latter means assuring that the tuner will move on to the next station.

4. In radio receiving means having radio and audio amplifying and detecting sections and means to tune the receiver over a predetermined frequency band, driving means to move the tuning means slowly to scan the band in one direction and quickly return it in the opposite direction, coupling means connected between the radio section and the detector section in which a control pulse is generated, a multistage control section, means connecting said coupling means to the input of the first stage of the control section so that the generated pulse will operate the same, a second stage in the control section connected to the first, a relay connected in the output of the second stage for controlling the driving means, switching means operated by the relay means to control the driving means, and also connected to the audio amplifying means to change the bias thereon.

5. In radio receiving means, conductive means upon which a control voltage is generated by the appearance of an incoming signal, a second conductive means upon which a second control voltage is generated in inverse phase by the incoming signal for amplitude control, time delay means connected to the latter conductive means, tuning means for the receiver, means for driving the tuning means over the frequency spectrum, switching means controlling the driving means, relay means to actuate the switching means and electronic means having input and output connections, the output being connected to the relay means and to the time delay circuit and the input being connected to the first conductive means and to the time delay circuit.

6. In radio receiving means, conductive means upon which a control voltage is generated by the appearance of an incoming signal, a second conductive means upon which a second control voltage is generated in inverse phase by the incoming signal for amplitude control, time delay means connected to the latter conductive means, tuning means for the receiver, means for driving the tuning means over the frequency spectrum, switching means controlling the driving means, relay means to actuate the switching means, electronic means having input and output connections, the output being connected to the relay means and to the time delay circuit and the input being connected to the first conductive means and to the time delay circuit, and switching means in the connection from the output of the electronic means to the time delay circuit operable at will.

7. In radio receiving means having radio and audio amplifier sections with cathodes, a detector section and tuning means, driving means to move the tuning means over the frequency spectrum, switching means controlling the driving means, relay means operating the switching means, conductive means upon which an independent control indexing pulse is generated by the appearance of an incoming signal, independent electronic control means having an input and an output circuit, said conductive means being connected to the input of the electronic means and said relay means connected to the output, and cathode biasing means for the audio amplifying section connected to the switching means to be varied by the relay operation.

8. In radio receiving means having radio and audio amplifying and detecting sections with cathodes and means to tune the receiver over a predetermined frequency band, driving means to move the tuning means, switching means to control the driving means, relay means to operate the switching means, conductive means upon which a voltage is developed upon receipt of an incoming signal, electronic control means having an input and an output circuit, said input being connected to the conductive means and said output to said relay, and resistor means connected to the cathode circuit of the audio amplifying means and to the switching means to determine the bias on the audio amplifier and as the switching means is operated to change the bias on the audio amplifying means so that the current drain of the audio amplifier will be reduced during searching periods to compensate for the relay circuit drawing more current and thus maintain a substantially constant current demand.

9. In radio receiving means, conductive means upon which a control voltage is generated by the appearance of an incoming signal, a second conductive means upon which a second control voltage is generated in inverse phase by the incoming signal for amplitude control, time delay means connected to the latter conductive means, tuning means for the receiver, means for driving the tuning means over the frequency spectrum, switching means controlling the driving means, relay means to actuate the switching means, electronic means having input and output connections, the output being connected to the relay means and to the time delay circuit and the input being connected to the first conductive means and to the time delay circuit, and a plurality of resistors in parallel connected to the electronic means to provide a bias for the same, one of said resistors being connected to the switching means to be included or removed from the system by the opening and closing of said switching means.

JAMES H. GUYTON.

References Cited in the file of this patent

UNITED STATES PATENTS

| Number | Name | Date |
|---|---|---|
| 2,304,871 | Andrews | Dec. 15, 1942 |
| 2,541,018 | Andrews | Feb. 13, 1951 |
| 2,550,430 | Schwarz et al. | Apr. 24, 1951 |